United States Patent [19]

Dixon et al.

[11] 4,177,436
[45] Dec. 4, 1979

[54] CIRCUIT FOR CONTROLLING THE DIFFERENTIAL OUTPUT POWER OF A SEMICONDUCTOR LASER

[75] Inventors: Richard W. Dixon, Bernardsville; Joseph F. Svacek, III, Jamesburg, both of N.J.

[73] Assignee: Bell Telephone Laboratories, Incorporated, Murray Hill, N.J.

[21] Appl. No.: 857,585

[22] Filed: Dec. 5, 1977

[51] Int. Cl.² .............................................. H01S 3/13
[52] U.S. Cl. ................................. 331/94.5 S; 307/312
[58] Field of Search ...................... 331/94.5 S, 94.5 H; 307/312, 311, 297, 310, 318

[56] References Cited

U.S. PATENT DOCUMENTS

| 3,898,588 | 8/1975 | Skagerlund | 331/112 |
| 4,015,150 | 3/1977 | Jones | 307/311 |
| 4,086,503 | 4/1978 | Fox et al. | 307/311 X |

FOREIGN PATENT DOCUMENTS 2447674  4/1976  Fed. Rep. of Germany ........... 307/311

OTHER PUBLICATIONS

R. W. Campbell et al; *Semiconductor Diode Lasers*, 1972, pp. 75–81.
Dawson, "Shunt diode extends linear range of LED" *Electronics*, Nov. 10, 1977, p. 119.

*Primary Examiner*—James W. Davie
*Attorney, Agent, or Firm*—Michael J. Urbano

[57] ABSTRACT

The apparent differential output power or quantum efficiency of a semiconductor laser, such as a double heterostructure laser diode, is reduced by means of a circuit which shunts the laser and includes a threshold device. The I-V characteristic of the shunt circuit intersects that of the laser at $V_x$ such that at voltages below $V_x$ the current through the laser exceeds that through the shunt, and conversely above $V_x$. Specific embodiments of the shunt circuit include a resistor in series with either a zener diode or one or more forward-biased conventional diodes.

12 Claims, 6 Drawing Figures

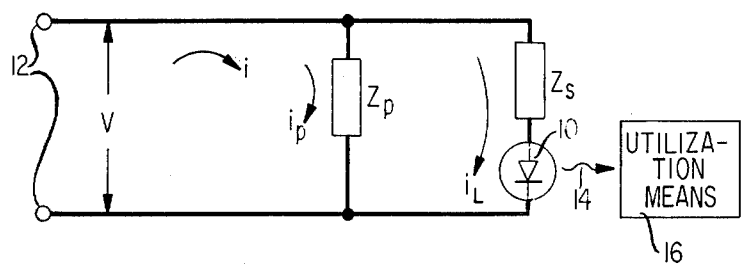
FIG. 1
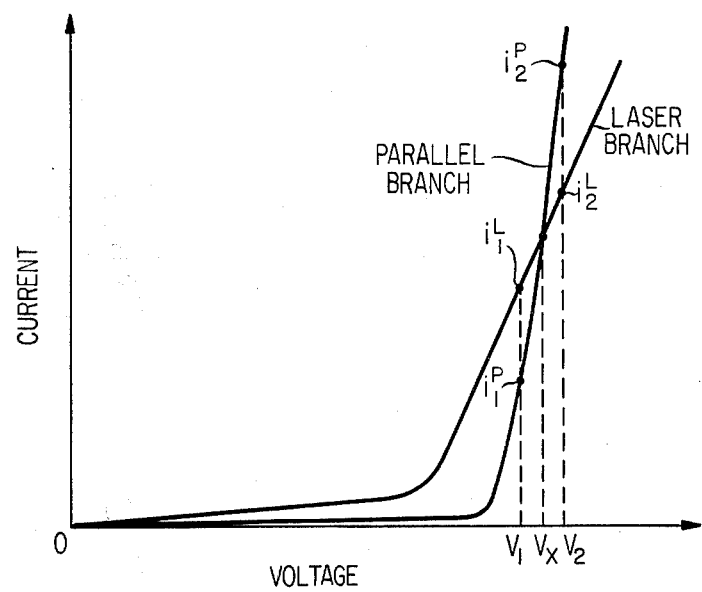
FIG. 2
FIG. 3
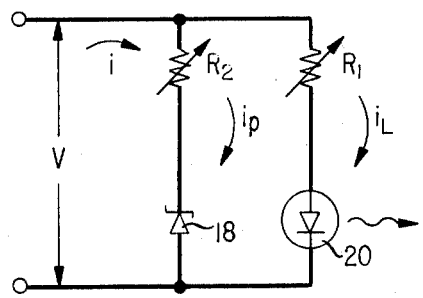
FIG. 5
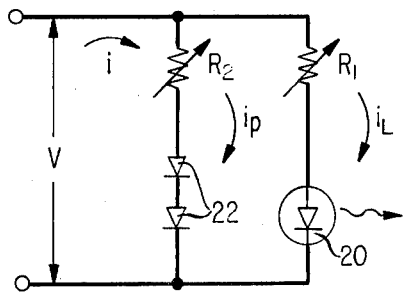

CIRCUIT FOR CONTROLLING THE DIFFERENTIAL OUTPUT POWER OF A SEMICONDUCTOR LASER

BACKGROUND OF THE INVENTION

This invention relates to semiconductor lasers.

In some applications of semiconductor lasers it is desirable that the differential optical output power (or differential quantum efficiency) be as large as possible. If the differential quantum efficiency were unity, each additional electron flowing in the external circuit would achieve the ideal of generating precisely one additional lasing photon, which in a symmetric AlGaAs double heterostructure laser, for example, would correspond to a differential output power of nearly 0.8 mW/mA at each laser mirror. Although unity differential quantum efficiency has not been achieved, values as high as 0.78 have been measured and values in the range 0.2 to 0.6 are routine. It is conceivable that values more closely approaching unity will result from further device development efforts.

It is common, on the other hand, for some users of semiconductor lasers to prefer smaller rather than larger values of differential output power; for example, when feedback stabilized optical outputs are needed. Such lasers also burn out less easily when subjected to excessive current transients. It has also been observed that lasers with high differential quantum efficiencies tend more frequently to exhibit self-pulsations in certain current ranges.

SUMMARY OF THE INVENTION

We have developed an external circuit which decreases the apparent differential quantum efficiency of a semiconductor laser and thereby should decrease the criticality of feedback stabilization circuits, decrease the susceptibility to laser damage from current overshoots, and perhaps decrease the tendency toward self-pulsation.

The circuit, which includes a threshold device, is connected in parallel with the semiconductor laser and has an I-V characteristic which intersects that of the laser at $V_x$ such that at voltages below $V_x$ the current through the laser exceeds that through the circuit whereas above $V_x$ the converse is true. Depending on the operating voltage chosen, the circuit can act either to lower the apparent differential output power of the laser without significantly increasing its threshold; or it can act to prohibit excessive currents from flowing in the laser as might occur with undesired transient voltages.

Although the circuit may include numerous combinations of components, two suitable sets are a resistor in series with either a zener diode or one or more forward-biased conventional diodes.

BRIEF DESCRIPTION OF THE DRAWING

Our invention, together with its various features and advantages, can be readily understood from the following more detailed description taken in conjunction with the accompanying drawing in which:

FIG. 1 is a schematic of one embodiment of our invention which includes an impedance $Z_s$ in series with a semiconductor laser and an impedance $Z_p$ in parallel with the laser;

FIG. 2 is an I-V curve of the laser and parallel branches of FIG. 1;

FIG. 3 is a schematic of a specific embodiment of the circuit of FIG. 1 in which $Z_s = R_1$ and $Z_p$ is the series combination of $R_2$ and a zener diode;

FIG. 5 is a schematic of another specific embodiment of the circuit of FIG. 1 in which $Z_s = R_1$ and $Z_p$ is the series combination of Rhd 2 and a forward-biased conventional diode.

DETAILED DESCRIPTION

Figure 4:
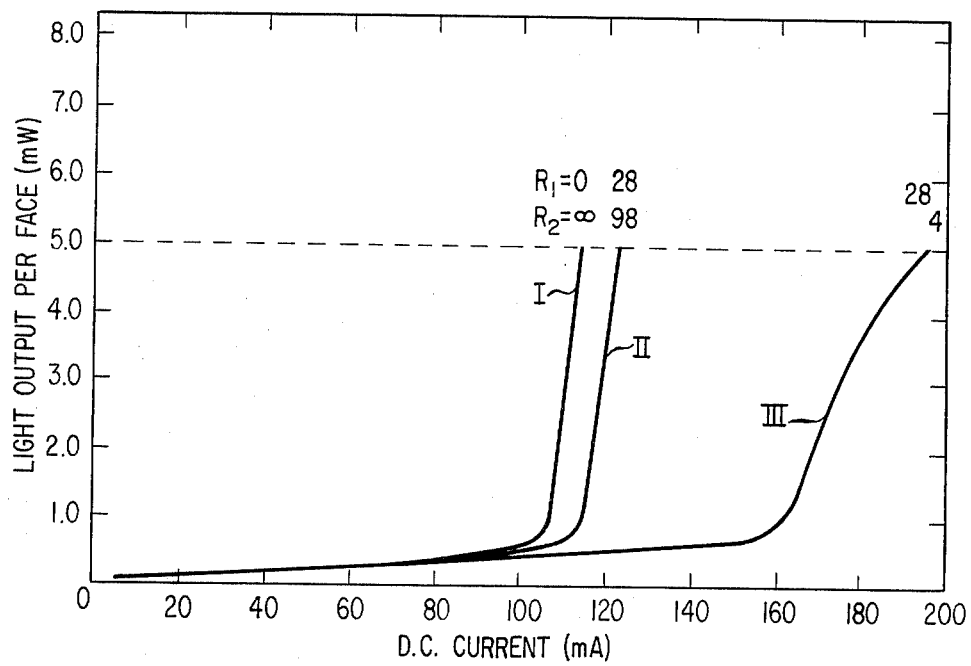
FIG. 4 is an L-i curve showing how the parallel branch of FIG. 3 reduces the differential output power of the semiconductor laser.

With reference now to FIG. 1, there is shown a schematic of an illustrative embodiment of our invention in which an impedance $Z_s$ is connected in series with a semiconductor laser 10 and an impedance $Z_p$ is connected in parallel with $Z_s$ and the laser. The parallel combination is driven by a power source (not shown) which supplies voltage V and current i at the input terminals 12. The current divides into components $i_p$ flowing in the parallel branch through $Z_p$, and current $i_L$ flowing in the laser branch through the laser 10 and $Z_s$.

The power source supplies sufficient current $i_L$ to drive the laser above its lasing threshold where it emits stimulated radiation 14. That radiation is coupled to utilization means 16. Illustratively, the laser is a double heterostructure junction laser which is coupled via suitable fiber optics to a photodetector such as a p-i-n photodiode or an avalanche photodiode.

While many possible component combinations are possible for $Z_p$ and $Z_s$, in general they are chosen in accordance with our invention to have the current-voltage characteristics shown in FIG. 2, and $Z_p$ is chosen to include a threshold device. The most important property is that for high voltages (above the cross-over voltage $V_x$) the current through the laser lies below the current through the parallel branch, while for low voltages (less than the cross-over $V_x$) the converse is true. Thus, if a voltage $V_1 < V_x$ is applied to this series-parallel combination, current $i_1^L (> i_1^P)$ will flow through the laser. Conversely, if voltage $V_2 > V_x$ is applied, $i_2^L (< i_2^P)$ will flow through the laser. Depending on the operating voltage chosen, such a circuit can act either to lower the apparent differential output power of the laser, without significantly increasing its threshold current; or it can act to prohibit excessive currents from flowing in the laser, as might occur with undesired transient voltages.

EXAMPLE 1

In one embodiment of our invention shown in FIG. 3, $Z_s$ is a resistor $R_1$, $Z_p$ is the series combination of a resistor $R_2$ and a zener diode 18, and laser 20 is a double heterostructure diode laser poled opposite to zener diode 18. If ideal components are considered, the zener diode 18 has the property that it does not conduct below a voltage $V_z$, but conducts with zero differential impedance above that voltage. The ideal laser has a similar voltage clamping property due to the pinning of the quasi-Fermi levels at lasing threshold and looks like an ideal diode at lower voltages. Any laser series resistance may be lumped into $R_1$. Above the point of zener breakdown one has for the parallel branch:

$$V = i_p R_2 + V_z^o, \quad (1)$$

and for the laser branch above threshold $$V = i_L R_1 + V_L^o, \quad (2)$$

where the zero superscript designates operation above threshold or breakdown. Thus, the ratio of differential currents in the two branches is simply $$di_p/di_L = R_1/R_2, \quad (3)$$

or the ratio of differential laser current to differential input current is $$di_L/di = R_2/(R_1 + R_2) \quad (4).$$

By adjusting $R_1$ and $R_2$ any desired fraction of the input current may be shunted away from the laser.

The ratio of total input current to total current in the laser arm is $$\frac{i}{i_L} 1 + \frac{R_1}{R_2}\left(\frac{V - V_z^o}{V - V_L^o}\right), V \geq V_z^o, V_L^o. \quad (5)$$

For $V < V_z^o$ all current flows in the laser arm ($V_z^o > V_L^o$ in the typical case of interest). Thus, in this idealized case one can arrange that no threshold current penalty exists. From the external terminals the laser appears to have a reduced differential output power with no change in threshold.

FIG. 4 shows the laser light output versus total input current measured with the circuit of FIG. 3. The zener diode 18 used was a WE 448B manufactured by Western Electric Company, Incorporated and had a nominal breakdown voltage of 4.3 volts, whereas the laser 20 was a standard stripe geometry AlGaAs double heterostructure diode laser of the type described by J. C. Dyment, et al. in *Proceedings of the IEEE*, Vol. 60, p. 726 (1972) and had a threshold at about 105 mA and 5V. With $R_2$ removed and $R_1$ set to zero the light-current relation marked $R_1 = 0$, $R_2 = \infty$ (curve I) was obtained. This is the normal L-i characteristics of laser 20. The point of 5 mW of light output per laser mirror is indicated in the figure. The light output-current relations are also shown for two other sets of values: $R_1 = 28\Omega$ and $R_2 = 98\Omega$ (curve II); and $R_1 = 28\Omega$ and $R_2 = 4\Omega$ (curve III). As is evident from curve III, making $R_1 >> R_2$ decreases the slope of the L-i curves above threshold; i.e., it decreases the differential output power. Due to the non-ideal nature of the laser and zener diode characteristics, some threshold current penalty was extracted in order to get the differential optical power output to decrease significantly. Nevertheless, it is clear that the differential efficiency was decreased to one-fifth of its initial value with less than a 75% increase in threshold current. Thus, the basic notion, that the differential efficiency could be reduced, was verified. The same kind of reduction, but with much smaller increases in lasing threshold, was achieved by the embodiment described in Example 2 below.

EXAMPLE 2

In accordance with another embodiment of our invention, resistors $R_1$ and $R_2$ are again placed in series with the laser and in the parallel branch, respectively, but the parallel branch now includes a forward-biased diode 22 (or several in series) instead of a zener diode. Diode 22 and the laser diode 20 are poled in the same direction. The current-voltage relationships above lasing threshold, using ideal components, are, for the parallel branch:

$$V = i_P R_2 + \beta^{-1} \ln(i_P/i_o), \quad (6)$$

where $\beta$ is the coefficient of the voltage in the ideal diode equation and $i_o$ is the so-called saturation current. For the laser branch $$V = i_L R_1 + V_L^o \quad (7).$$

The ratio of differential currents in the two branches is $$\frac{di_P}{di_L} = \frac{i_P \beta R_1}{1 + i_P \beta R_2}. \quad (8)$$

Thus, the ratio of differential terminal current to differential laser current is $$\frac{di}{di_L} = \frac{1 + i_P \beta (R_1 + R_2)}{1 + i_P \beta R_2}, \quad (9)$$

while the ratio of total input current to total laser current is $$i/i_L = 1 + i_P/i_L \quad (10)$$

For the special case in which $i_P \beta R_2 << 1$, relationships (8) and (9) become particularly simple, i.e., $$di_P/di_L \simeq i_P \beta R_1, \quad (8')$$
$$di/di_L \simeq 1 + i_P \beta R_1 \quad (9').$$

Thus, in this case the differential current through the laser is decreased by the factor $\beta R_1$ compared with the total current. In theory $\beta$ can be as high as 40 V$^{-1}$, so that for relatively small values of $R_1$ this factor can be quite large. Provided the parallel branch diode parameters are carefully selected, current in this branch below lasing threshold can obviously be quite small.

Figure 6:
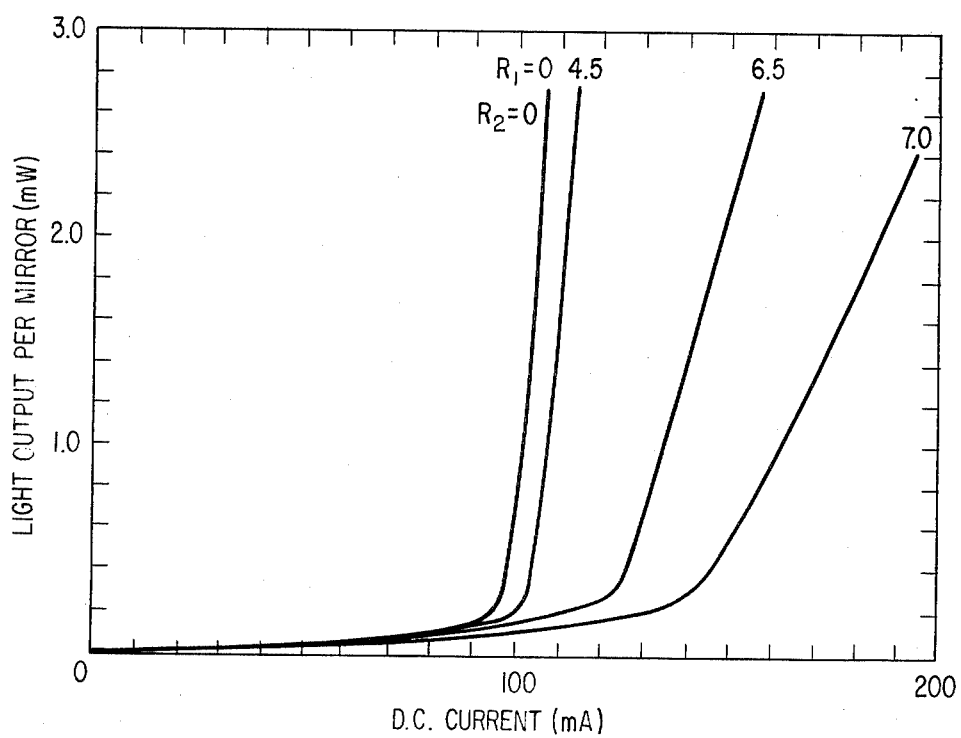
FIG. 6 is an L-i curve showing how the parallel branch of FIG. 5 reduces the differential output power of the semiconductor laser.

In order to make the measurements shown in FIG. 6 a standard double heterostructure laser 20 was again used, $R_2$ was set equal to zero, and a WE 426H diode package manufactured by Western Electric Company, Incorporated was inserted in the parallel branch as the diode 22. This package contained three Si diodes connected in series and had a measured $\beta$ of approximately 9.3. This relatively low $\beta$ value could be increased by using fewer junctions since in a series combination of N identical diodes the effective $\beta^e$ of the combination is $\beta/N$, $\beta$ being the value for an individual diode. More generally $(\beta^e)^{-1} = \Sigma_i(\beta_i)^{-1}$. Thus, the value 9.3 could be increased, for example, by using diodes made from materials with larger bandgaps, e.g., GaAlAs or GaP. As can be seen from the data in FIG. 6, $R_1$ values of a few ohms are sufficient with this circuit to cause significant conduction into the parallel branch. Using the value $R_1 = 6.5\Omega$, for example, reduced the measured differential quantum efficiency from 0.62 to 0.25 while increasing the lasing threshold current by only 25%, whereas using $R_1=7.0\Omega$ reduced the efficiency from 0.62 to 0.11 while increasing the threshold by an additional 13%.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention.

In particular, although examples have been given in which $Z_p$ includes a zener diode or conventional diodes, other threshold devices such as transistors or heterojunction devices are also contemplated within the scope of the invention; so are threshold sensing elements combined with amplifiers and feedback arrangements adequate for producing a suitably nonlinear current-voltage relation. In addition, junction lasers with configurations other than simple double heterostructures (e.g., buried heterostructures of various types) and lasers made of materials other than AlGaAs (e.g., AlGaAsSb-GaAsSb or InGaAsP-InP) are also suitable. Finally, while our invention has for simplicity been described in terms of discrete devices, it is also feasible to incorporate the laser and shunt circuit in an integrated circuit form.

What is claimed is:

1. A circuit for controlling the output of a semiconductor laser comprising, in parallel with said laser, a circuit branch including a threshold device and having a current-voltage characteristic which intersects that of said laser at a cross-over voltage $V_x$ such that, for voltages less than $V_x$ the current through said laser exceeds that through said branch, whereas for voltages greater than $V_x$ the current through said laser is less than the current through said branch.

2. The circuit of claim 1 wherein said laser comprises a laser diode and said threshold device comprises a zener diode poled opposite to said laser diode.

3. The circuit of claim 2 including a first resistor in series with said zener diode and a second resistor in series with said laser diode.

4. The circuit of claim 3 wherein the resistance of said second resistor is much greater than that of said first resistor.

5. The circuit of claim 1 wherein said laser comprises a laser diode and said threshold device comprises at least one forward-biased diode poled in the same direction as said laser diode.

6. The circuit of claim 5 wherein said threshold device comprises a plurality of series-connected forward-biased diodes.

7. The circuit of claim 5 including a first resistor in series with said diode of said threshold device and a second resistor in series with said laser diode.

8. The circuit of claim 7 wherein the resistance of said second resistor is much greater than that of said first resistor.

9. A circuit comprising
 a first laser branch including a semiconductor laser diode,
 a second shunt branch, in parallel with said first branch, including a threshold device,
 means for applying voltage and current to said branches,
 said branches being mutually adapted so that the current-voltage characteristic of said shunt branch intersects that of said laser branch at a cross-over voltage $V_x$ such that for voltage below $V_x$ the current through said shunt branch is less than that through said laser branch, whereas for voltages greater than $V_x$ the current through said shunt branch exceeds that through said laser branch.

10. The circuit of claim 9 wherein said threshold device comprises a zener diode poled opposite to said laser diode and said shunt branch includes a resistor in series with said zener diode.

11. The circuit of claim 9 wherein said threshold device comprises at least one forward-biased diode poled in the same direction as said laser diode.

12. The circuit of claim 11 wherein said threshold device comprises a plurality of series-connected, forward-biased diodes.

* * * * *